(12) United States Patent
Jeong et al.

(10) Patent No.: US 11,114,881 B2
(45) Date of Patent: Sep. 7, 2021

(54) LOAD SWITCH CIRCUIT AND METHOD OF CONTROLLING BATTERY POWER USING THE SAME

(71) Applicant: SAMSUNG ELECTRONICS CO., LTD., Suwon-si (KR)

(72) Inventors: Tae-Jin Jeong, Incheon (KR); Hyun-Su Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 274 days.

(21) Appl. No.: 16/436,574

(22) Filed: Jun. 10, 2019

(65) Prior Publication Data
US 2020/0099229 A1    Mar. 26, 2020

(30) Foreign Application Priority Data

Sep. 21, 2018    (KR) .......................... 10-2018-0113414

(51) Int. Cl.
| | |
|---|---|
| *H02J 7/00* | (2006.01) |
| *G01R 19/165* | (2006.01) |
| *H01M 10/42* | (2006.01) |
| *H02M 3/07* | (2006.01) |
| *H01M 10/48* | (2006.01) |

(Continued)

(52) U.S. Cl.
CPC ........ *H02J 7/008* (2013.01); *G01R 19/16519* (2013.01); *G05F 1/461* (2013.01); *H01M 10/425* (2013.01); *H01M 10/44* (2013.01); *H01M 10/48* (2013.01); *H02J 7/007* (2013.01); *H02J 7/00712* (2020.01); *H02M 3/07* (2013.01)

(58) Field of Classification Search
CPC ........ H02J 7/008; H02J 7/007; H02J 7/00712; G01R 19/16519; G05F 1/461; H02M 3/07; H01M 10/425; H01M 10/44; H01M 10/48
USPC ........................................................ 320/134
See application file for complete search history.

(56) References Cited

U.S. PATENT DOCUMENTS

| | | | |
|---|---|---|---|
| 7,764,054 | B1 | 7/2010 | Guo et al. |
| 8,436,595 | B2 | 5/2013 | Simmons et al. |
| 8,450,990 | B2 | 5/2013 | Shi et al. |

(Continued)

FOREIGN PATENT DOCUMENTS

| | | |
|---|---|---|
| KR | 0619899 | 8/2006 |
| KR | 1505894 | 3/2015 |
| KR | 1520988 | 5/2015 |

*Primary Examiner* — Nathaniel R Pelton
(74) *Attorney, Agent, or Firm* — Volentine, Whitt & Francos, PLLC

(57) ABSTRACT

A load switch circuit includes a charging transistor, a current sensor, a voltage sensor, a selector, a current controller and a mode controller. The charging transistor is connected between a first switch node and a second switch node and controls a charging current in response to a charging control signal. The current sensor is connected to the first switch node and the second switch node and senses the charging current to generate a current sensing signal. The voltage sensor is connected to the first switch node and the second switch node and senses a source-drain voltage of the charging transistor to generate a voltage sensing signal. The selector selects the current sensing signal or the voltage sensing signal in response to a mode signal to generate a selection voltage signal. The current controller compares the selection voltage signal with a reference voltage to generate the charging control signal.

20 Claims, 14 Drawing Sheets

(51) Int. Cl.
    *G05F 1/46*     (2006.01)
    *H01M 10/44*     (2006.01)

(56) References Cited

U.S. PATENT DOCUMENTS

| | | |
|---|---|---|
| 8,547,065 B2 | 10/2013 | Trigiani |
| 8,653,796 B2 | 2/2014 | Tam |
| 8,917,034 B2 | 12/2014 | Cozzolino et al. |
| 9,577,613 B2 | 2/2017 | Yang et al. |
| 9,876,367 B2 | 1/2018 | Trigiani |
| 2006/0055249 A1 | 3/2006 | Choi |
| 2018/0145517 A1 | 5/2018 | Krishna et al. |
| 2018/0145519 A1 | 5/2018 | Trigiani |
| 2018/0233926 A1* | 8/2018 | Chang .................. H01M 10/46 |
| 2019/0207392 A1* | 7/2019 | Luo ...................... H02J 7/0071 |
| 2019/0222041 A1* | 7/2019 | Liu ....................... H02J 7/0031 |

* cited by examiner

LOAD SWITCH CIRCUIT AND METHOD OF CONTROLLING BATTERY POWER USING THE SAME

CROSS-REFERENCE TO RELATED APPLICATION

This U.S. non-provisional application claims priority under 35 USC § 119 to Korean Patent Application No. 10-2018-0113414, filed on Sep. 21, 2018, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a load switch circuit and a method of controlling battery power using the load switch circuit.

2. Discussion of the Related Art

Many mobile devices such as smart phones, notebook computers and the like have built-in, switching power supply circuits that are powered by an external power source. For example, when a power adapter having a regulated output is plugged into a smart phone, a switching power supply circuit in the mobile device draws current from the plugged-in power adapter and generates a required voltage for charging a battery of the mobile device and/or for operating the other components of the device. When the power adapter is removed, the battery may discharge the charge to supply power to the other components. When the external power source operates abnormally or when the load of the other components varies abruptly, the charging current and/or the discharging current of the battery may deviate from the specified range. Such overshoot and/or undershoot of the charging and discharging currents may reduce performance and lifetime of the battery.

SUMMARY

Some example embodiments may provide a load switch circuit capable of efficiently controlling charging and/or discharging of a battery.

Some example embodiments may provide a method of controlling battery power capable of efficiently controlling charging and/or discharging of a battery.

According to example embodiments, a load switch circuit includes a charging transistor, a current sensor, a voltage sensor, a selector, a current controller and a mode controller. The charging transistor is connected between a first switch node to which a battery voltage is applied and a second switch node to which a charging voltage is applied and controls a charging current in response to a charging control signal. The current sensor is connected to the first switch node and the second switch node and senses the charging current to generate a current sensing signal. The voltage sensor is connected to the first switch node and the second switch node and senses a source-drain voltage of the charging transistor to generate a voltage sensing signal. The selector selects one of the current sensing signal and the voltage sensing signal in response to a mode signal to generate a selection voltage signal. The current controller compares the selection voltage signal with a reference voltage to generate the charging control signal.

According to example embodiments, a load switch circuit includes a charging transistor connected between a first switch node to which a battery voltage is applied and a second switch node and is configured to control a charging current in response to a charging control signal. A discharging transistor is connected between a third switch to which a charging voltage is applied and the second switch node and configured to control a discharging current in response to a discharging control signal. A first current sensor is connected to the first switch node and the second switch node and configured to sense the charging current to generate a first current sensing signal. A second current sensor is connected to the third switch node and the second switch node and configured to sense the discharging current to generate a second current sensing signal. A first voltage sensor is connected to the first switch node and the second switch node and configured to sense a source-drain voltage of the charging transistor to generate a first voltage sensing signal. A second voltage sensor is connected to the third switch node and the second switch node and configured to sense a source-drain voltage of the discharging transistor to generate a second voltage sensing signal. A first selector is configured to select one of the first current sensing signal and the first voltage sensing signal in response to a first mode signal to generate a first selection voltage signal. A second selector is configured to select one of the second current sensing signal and the second voltage sensing signal in response to a second mode signal to generate a second selection voltage signal. A first current controller is configured to compare the first selection voltage signal with a first reference voltage to generate the charging control signal. A second current controller is configured to compare the second selection voltage signal with a second reference voltage to generate the discharging control signal.

According to example embodiments, a method of controlling battery power includes generating a first current sensing signal by sensing a charging current flowing through a charging transistor. A first voltage sensing signal is generated by sensing a source-drain voltage of the charging transistor. A first selection voltage signal is generated by selecting one of the first current sensing signal and the first voltage sensing signal in response to a first mode signal. The charging current is controlled by comparing the first selection voltage signal with a first reference voltage.

According to example embodiments, a load switch circuit includes a transistor, a current sensor, a voltage sensor, and a control circuit. The transistor regulates current flowing between a first node and a second node in response to a control signal. The current sensor generates a current signal reflecting an amount of the current, and the voltage sensor generates a voltage signal reflecting a voltage developed between the first node and the second node. The control circuit transitions from generating the control signal based on the voltage signal to generating the control signal based on the current signal when the current signal transitions from not exceeding a first reference value to exceeding the first reference value.

The load switch circuit and the method of controlling battery power using the load switch circuit according to example embodiments may reduce overshoot and/or undershoot of the charging current and/or the discharging current efficiently by performing selectively the voltage control mode or the current control mode based on the magnitude of the charging current and/or the magnitude of the discharging current.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
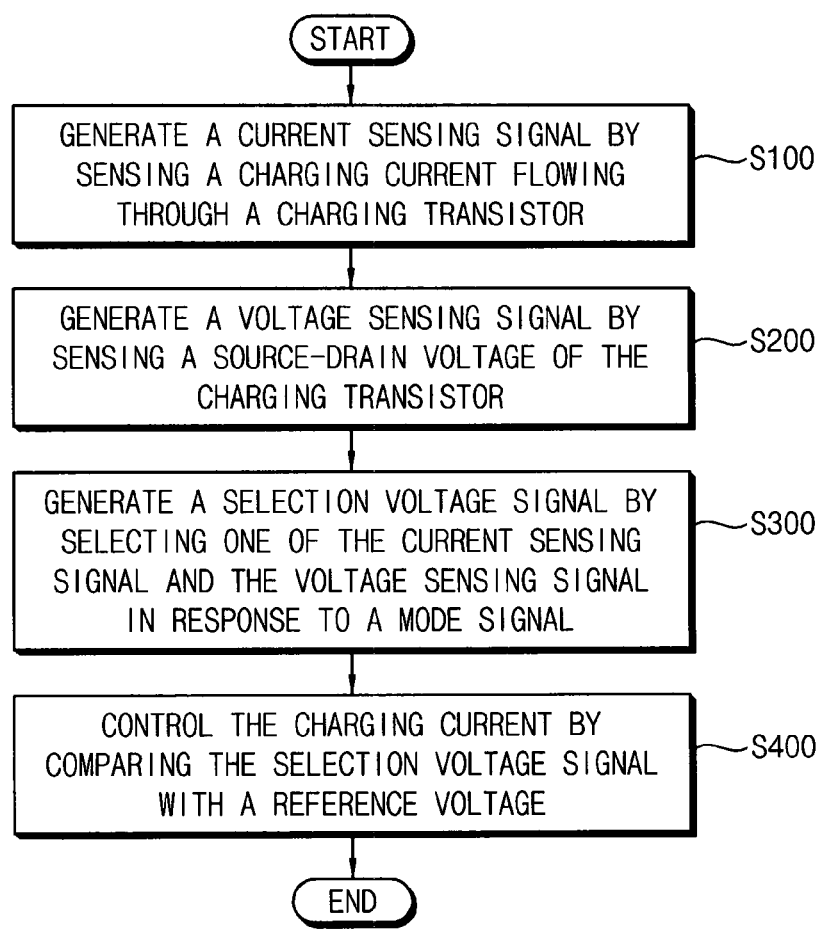
FIG. 1 is a flow chart illustrating a method of controlling battery power according to example embodiments.

Various example embodiments will be described more fully hereinafter with reference to the accompanying drawings, in which some example embodiments are shown. In the drawings, like numerals refer to like elements throughout.

FIG. 1 is a flow chart illustrating a method of controlling battery power according to example embodiments.

Referring to FIG. 1, a current sensing signal is generated by sensing a charging current flowing through a charging transistor (S100), where the charging transistor is connected between a battery voltage and a charging voltage. The current sensing signal may be a voltage signal having a voltage level that is varied depending on a magnitude of the charging current. In addition, a voltage sensing signal is generated by sensing a source-drain voltage of the charging transistor (S200). The voltage sensing signal may be a voltage signal having a voltage level that is varied depending on a magnitude of a source-drain voltage of the charging transistor. Example embodiments of generating the current sensing signal and the voltage sensing signal will be described below with reference to FIGS. 3 and 4.

A selection voltage signal is generated by selecting one of the current sensing signal and the voltage sensing signal in response to a mode signal (S300). The mode signal may indicate whether the charging current is lower than a limit current level. The mode signal may have a first logic level when the charging current is lower than the limit current level and a second logic level when the charging current is higher than the limit current level. Example embodiments of generating the mode signal will be described below with reference to FIGS. 7 and 8.

The charging current is controlled by comparing the selection voltage signal with a reference voltage (S400). The control of the charging current may be performed by controlling a gate voltage applied to a gate electrode of the charging transistor. In other words, the charging current may be increased by increasing the gate voltage and decreased by decreasing the gate voltage. Example embodiments of generating the gate voltage, that is, a charging control signal will be described below with reference to FIGS. 5 and 6.

When the charging current is lower than the limit current level, the voltage sensing signal may be selected as the selection voltage signal. In this case, the charging current may be controlled based on the voltage sensing signal, which may be referred to as a voltage control mode. In contrast, when the charging current is higher than the limit current level, the current sensing signal may be selected as the selection voltage signal. In this case, the charging current may be controlled based on the current sensing signal, which may be referred to as a current control mode.

As such, the method of controlling battery power according to example embodiments may reduce overshoot and/or undershoot of the charging current efficiently by performing selectively the voltage control mode or the current control mode based on the magnitude of the charging current.

Figure 2:
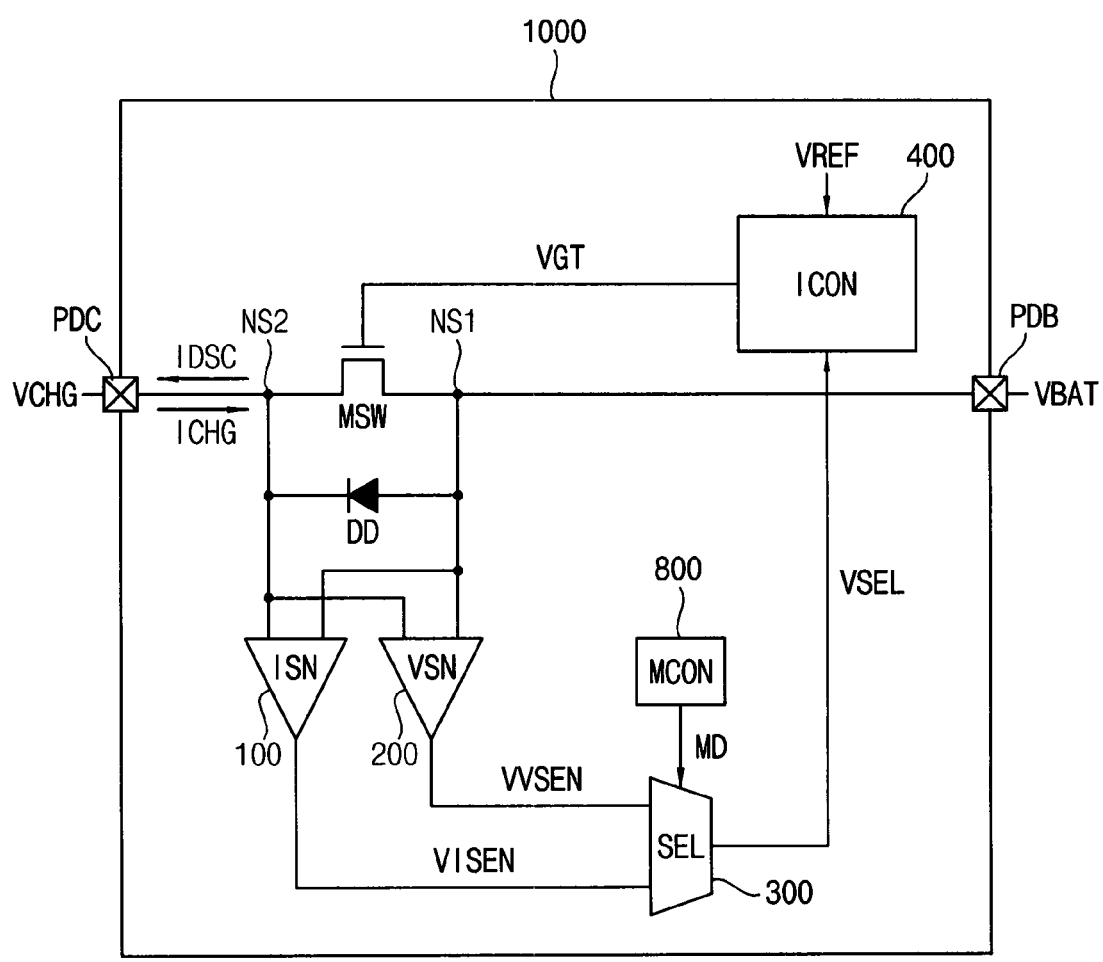
FIG. 2 is a block diagram illustrating a load switch circuit according to example embodiments.

FIG. 2 is a block diagram illustrating a load switch circuit according to example embodiments.

Referring to FIG. 2, a load switch circuit 1000 may include a charging transistor MSW, a current sensor ISN 100, a voltage sensor VSN 200, a selector SEL 300, a current controller ICON 400, a mode controller MCON 800 and a diode DD.

The charging transistor MSW is connected between a first switch node NS1 to which a battery voltage VBAT is applied and a second switch node NS2 to which a charging voltage VCHG is applied, and the charging transistor MSW controls a charging current ICHG in response to a charging control signal VGT. The first switch node NS1 and the second switch node NS2 correspond to a drain node and a source node of the charging transistor MSW. The charging current ICHG is a current flowing through the charging transistor MSW from the second switch node NS2 to the first switch node NS1 when the charging voltage VCHG is higher than the battery voltage VBAT. When the battery voltage VBAT is higher than the charging voltage VCHG, a discharging current IDSC flows from the first switch node NS1 to the second switch node NS2. In some example embodiments, the charging transistor MSW may be implemented with an N-type metal oxide semiconductor (NMOS) transistor.

The current sensor 100 is connected to the first switch node NS1 and the second switch node NS2 and senses the charging current ICHG to generate a current sensing signal VISEN. Example embodiments of the current sensor 100 will be described below with reference to FIG. 3.

The voltage sensor 200 is connected to the first switch node NS1 and the second switch node NS2 and senses a source-drain voltage of the charging transistor MSW to generate a voltage sensing signal VVSEN. Example embodiments of the voltage sensor 200 will be described below with reference to FIG. 4.

In some example embodiments, the load switch circuit 1000 may be implemented as one small chip that may be mounted in a mobile device. In this case, the load switch circuit 1000 may include a charging pad PDC to which the charging voltage VCHG is applied and a battery pad PDB to which the battery voltage VBAT is applied. The charging pad PDC may be connected to internal components of the mobile device such as a charging control circuit, power management integrated circuit, and so on. The battery pad PDB may be directly connected to a battery mounted in the mobile device.

The selector 300 selects one of the current sensing signal VISEN and the voltage sensing signal VVSEN in response to a mode signal MD to generate a selection voltage signal VSEL.

The current controller 400 compares the selection voltage signal VSEL with a reference voltage VREF to generate the charging control signal VGT. Example embodiments of the current controller 400 will be described below with reference to FIGS. 5 and 6.

The diode DD is connected between the first switch node NS1 and the second switch node NS2. The anode electrode of the diode DD is connected to the first switch node NS1 and the cathode electrode of the diode DD is connected to the second switch node NS2 so that the diode DD may be turned on in a discharging status.

When the battery connected to the battery pad PDB is charged through the load switch circuit 1000, the charging transistor MSW is controlled in the voltage control mode when the charging current ICHG is lower than the limit current level and the charging transistor MSW limits the charging current ICHG in the current control mode when the charging current ICHG is higher than the limit current level.

In the voltage control mode, the voltage sensing signal VVSEN is selected as the selection voltage signal VSEL and thus a voltage control loop comprised of the voltage sensor 200, the selector 300 and the current controller 400 is enabled. In contrast, in the current control mode, the current sensing signal VISEN is selected as the selection voltage signal VSEL and thus a current control loop comprised of the current sensor 100, the selector 300 and the current controller 400 is enabled.

When the battery connected to the battery pad PDB is discharged, the source-drain voltage of the charging transistor MSW is always controlled by the voltage control loop. There is no information on the charging current ICHG during the discharging status, that is, the charging current ICHG is zero. Accordingly the gate voltage of the charging transistor MSW is increased by a power supply voltage with respect to the source voltage and thus the charging transistor MSW is fully turned on during the discharging status.

As a result, the gate voltage, that is, the voltage level of the charging control signal VGT is determined by the voltage control loop regardless of the current direction with respect to a current lower than the limit current level. If the charging current ICHG is increased abruptly while the discharging current IDSC and/or the charging current ICHG is relatively low and the voltage control loop is enabled, the load switch circuit 1000 may transition from the voltage control loop to the current control loop to rapidly limit the charging current ICHG. Because the load switch circuit 1000 according to example embodiments maintains the continuous loop control regardless of the magnitude of the charging current ICHG, the load switch circuit 1000 may have a rapid response speed in comparison with the conventional load switch circuit that depends on only the current loop control.

As such, the load switch circuit 1000 and the method of controlling battery power using the load switch circuit 1000 according to example embodiments may reduce overshoot and/or undershoot of the charging current ICHG efficiently by performing selectively the voltage control mode or the current control mode based on the magnitude of the charging current ICHG.

Figure 3:
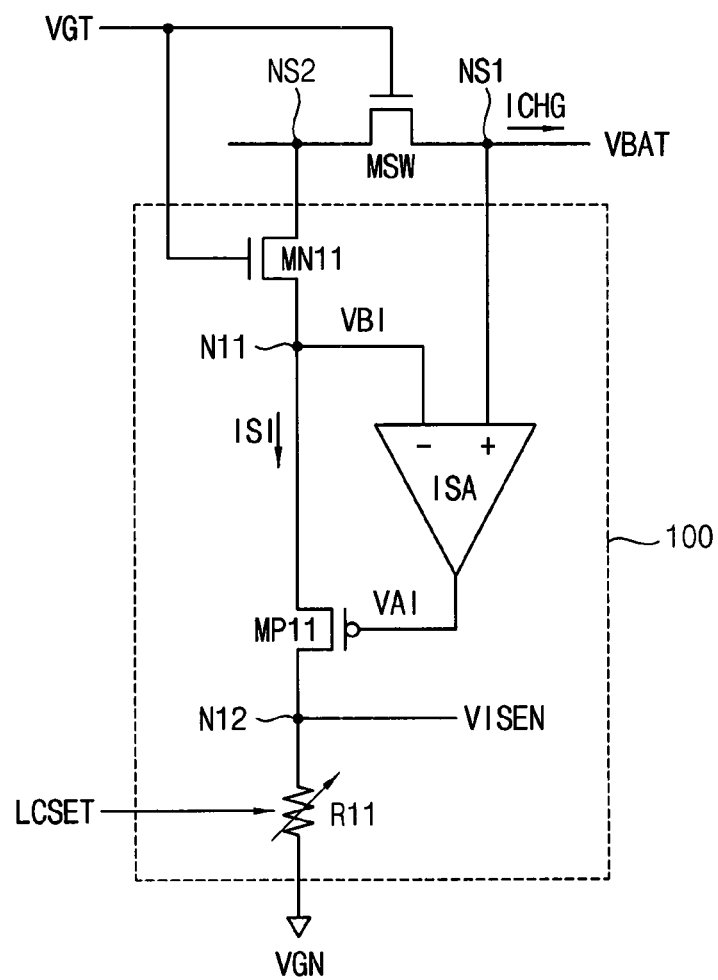
FIG. 3 is a circuit diagram illustrating an example embodiment of a current sensor included in the load switch circuit of FIG. 2.

FIG. 3 is a circuit diagram illustrating an example embodiment of a current sensor included in the load switch circuit of FIG. 2.

Referring to FIG. 3, a current sensor 100 may include an N-type metal oxide semiconductor (NMOS) transistor MN11, a P-type metal oxide semiconductor (PMOS) transistor MP11, a resistor R11 and a sense amplifier ISA.

The NMOS transistor MN11 is connected between the second switch node NS2 and a first node N11 and operates in response to the charging control signal VGT. The PMOS transistor MP11 is connected between the first node N11 and a second node N12 and operates in response to an amplification signal VAI. The resistor 11 is connected between the second node N12 and a ground voltage VGN. The sense amplifier ISA amplifies a difference between a sensing voltage VBI at the first node N11 and the battery voltage VBAT at the first switch node NS1 to generate the amplification signal VAI.

In the current sensor 100 of FIG. 3, the sensing voltage VBI and the battery voltage VBAT converge on substantially the same voltage level (Virtual Short) by a feedback operation of the sense amplifier ISA and the PMOS transistor MP11. Because the gate voltage, the source voltage and the drain voltage of the charging transistor MSW and the NMOS transistor MN11 are equivalent respectively, the sensing current ISI flowing through the NMOS transistor MN11 and the PMOS transistor MP11 may be determined by a size ratio of the charging transistor MSW and the NMOS transistor MN11. In other words, the ratio of the charging current ICHG and the sensing current ISI may be determined by the size ratio of the charging transistor MSW and the NMOS transistor MN11.

The sensing current ISI flows through the resistor R11 to cause a voltage drop across the resistor R11. The current sensing signal VISEN corresponding to a product ISI*R11 of the magnitude of the sensing current ISI and the resistance value of the resistor R11 may be generated through the second node N12. As a result, the current sensing signal VISEN proportional to the charging current ICHG may be provide through the second node N12.

In some example embodiments, the resistor R11 included in the current sensor 100 may be implemented with a variable resistor having a resistance value varying depending on a limit current setting value LCSET. In this case, the load switch circuit 1000 may control a resistance value of the variable resistor to adjust the voltage level of the current sensing signal VISEN. As a result, the limit current level of the charging current ICHG may be controlled by controlling the resistance value of the resistor R11. The limit current setting value LCSET may be a digital value of multiple bits.

Figure 4:
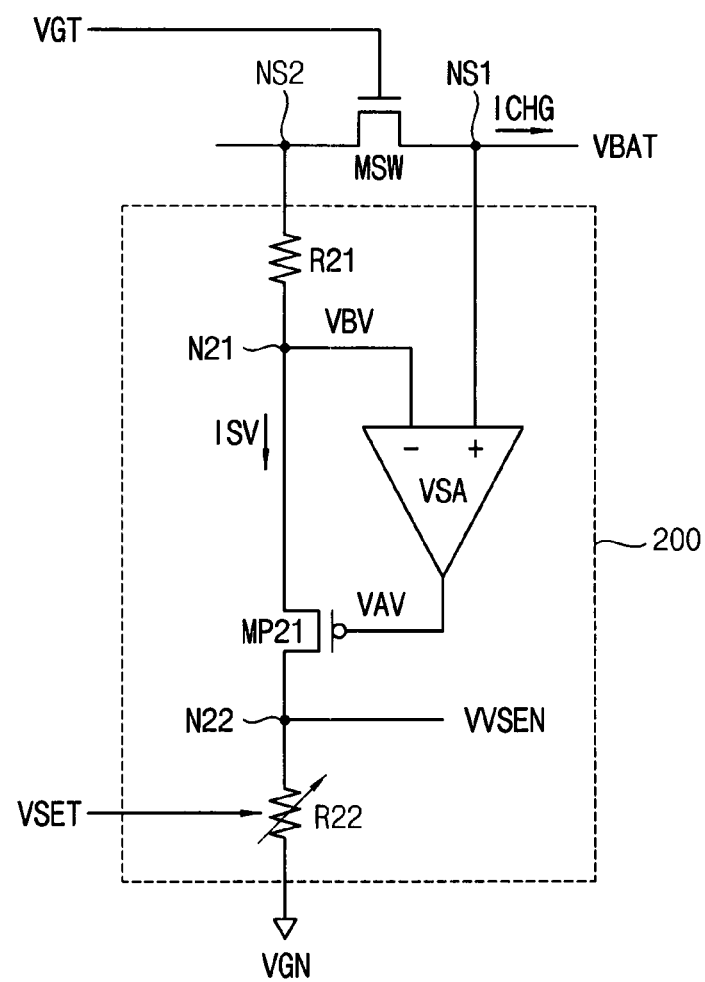
FIG. 4 is a circuit diagram illustrating an example embodiment of a voltage sensor included in the load switch circuit of FIG. 2.

FIG. 4 is a circuit diagram illustrating an example embodiment of a voltage sensor included in the load switch circuit of FIG. 2.

Referring to FIG. 4, a voltage sensor 200 may include a first resistor R21, a PMOS transistor MP21, a second resistor R22 and a sense amplifier VSA.

The first resistor R21 is connected between the second switch node NS2 and a first node N21. The PMOS transistor MP21 is connected between the first node N21 and a second node N22 and operates in response to an amplification signal VAV. The second resistor R22 is connected between the second node N22 and a ground voltage VGN. The sense amplifier VSA amplifies a difference between a sensing voltage VBV at the first node N21 and battery voltage VBAT at the first switch node NS1 to generate the amplification signal VAV.

In the voltage sensor 200 of FIG. 4, the sensing voltage VBV and the battery voltage VBAT converge on substantially the same voltage level (Virtual Short) by a feedback operation of the sense amplifier VSA and the PMOS transistor MP21. The source-drain voltage $\Delta V$ of the charging transistor MSW is applied to the first resistor R21, and the sensing current ISV of $\Delta V/R21$ flows through the PMOS transistor MP21.

The sensing current ISV flows through the second resistor R22 to cause a voltage drop across the second resistor R22. The voltage sensing signal VVSEN corresponding to a product $\Delta V*R22/R21$ of the magnitude $\Delta V/R21$ of the sensing current ISV and the resistance value of the second resistor R22 may be generated through the second node N22. The characteristics of the first resistor R21 and the second resistor R22 are canceled out, and as a result, the voltage sensing signal VVSEN proportional to the source-drain voltage $\Delta V$ of the charging transistor MSW may be provide through the second node N22.

In some example embodiments, the second resistor R22 included in the voltage sensor 200 may be implemented with a variable resistor having a resistance value varying depending on a voltage setting value VSET. In this case, the load switch circuit 1000 may control a resistance value of the variable resistor to adjust the voltage level of the voltage sensing signal VVSEN. As a result, the source-drain voltage $\Delta V$ of the charging transistor MSW may be controlled by controlling the resistance value of the second resistor R22. The voltage setting value VSET may be a digital value of multiple bits.

Figure 5:
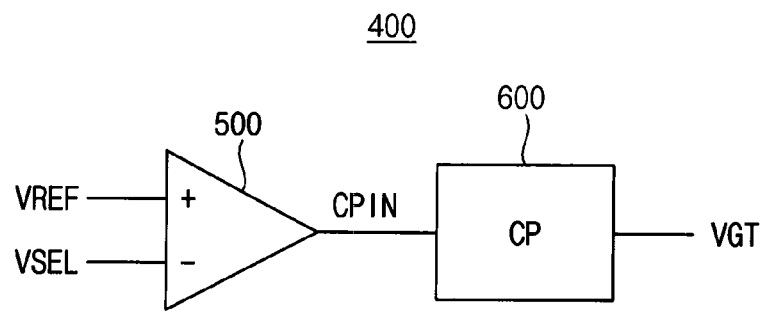
FIG. 5 is a circuit diagram illustrating an example embodiment of a current controller included in the load switch circuit of FIG. 2.
Figure 6:
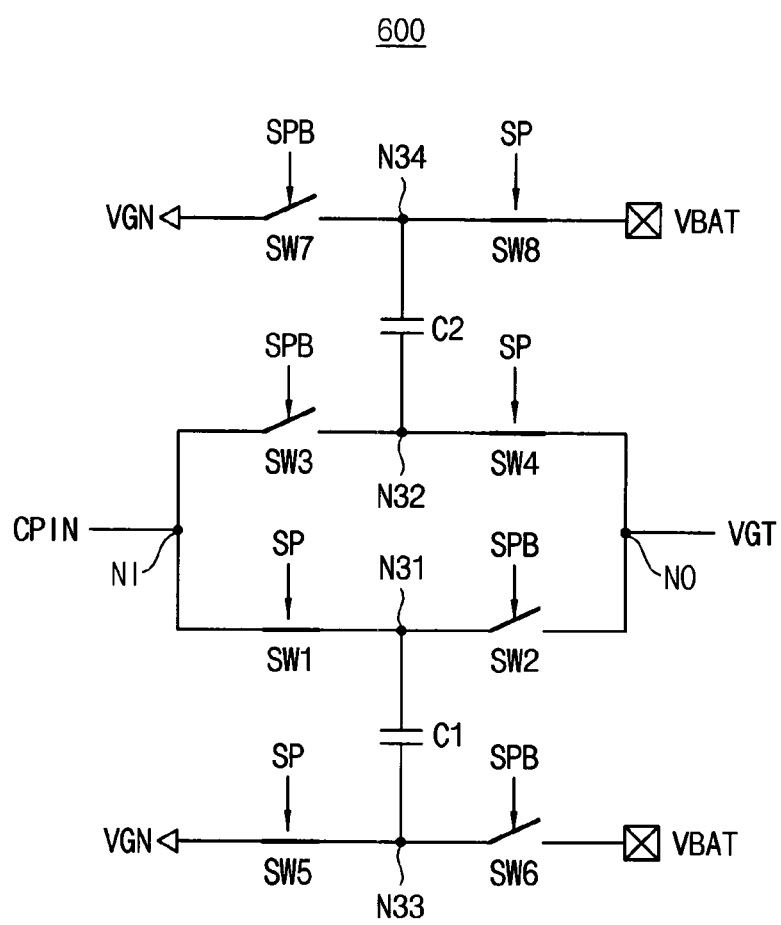
FIG. 6 is a circuit diagram illustrating an example embodiment of a charge pump included in the current controller of FIG. 5.

FIG. 5 is a circuit diagram illustrating an example embodiment of a current controller included in the load switch circuit of FIG. 2, and FIG. 6 is a circuit diagram illustrating an example embodiment of a charge pump included in the current controller of FIG. 5.

Referring to FIG. 5, a current controller 400 may include an error amplifier 500 and a charge pump (CP) 600.

The error amplifier 500 may amplify a difference between a reference voltage VREF and the selection voltage signal VSEL to generate an error amplification signal CPIN.

The charge pump 600 may sum the error amplification signal VSEL and the battery voltage VBAT to generate a charging control signal VGT.

Referring to FIG. 6, the charge pump 600 may include first through eighth switches SW1~SW8, a first capacitor C1 and a second capacitor C2.

The first switch SW1 is connected between an input node NI receiving the error amplification signal CPIN and a first node N31 and operates in response to a first signal SP. The second switch SW2 is connected between the first node N31 and an output node NO outputting the charging control signal VGT and operates in response to a second signal SPB corresponding to an inverted signal of the first signal SP.

The third switch SW3 is connected between the input node NI and a second node N32 and operates in response to the second signal SPB. The fourth switch SW4 is connected between the second node N32 and the output node NO and operates in response to the first signal SP.

The first capacitor C1 is connected between the first node N31 and a third node N33. The fifth switch SW5 is connected between the third node N33 and a ground voltage VGN and operates in response to the first signal SP. The sixth switch SW6 is connected between the third node N33 and the battery voltage VBAT and operates in response to the second signal SPB.

The second capacitor C2 is connected between the second node N32 and a fourth node N34. The seventh switch SW7 is connected between the fourth node N34 and the ground voltage VGN and operates in response to the second signal SPB. The eighth switch SW8 is connected between the fourth node N34 and the battery voltage VBAT and operates in response to the first signal SP.

The first signal SP and the second signal SPB may toggle complementarily between a first logic level (e.g., a logic low level) and a second logic level (e.g., a logic high level), like clock signals.

When the first signal SP is in the first logic level, that is, when the second signal SPB is in the second logic level, the voltage level of the error amplification signal CPIN applied to the input node NI charges the first capacitor C1 with respect to the ground voltage VGN with the first switch SW1 and the fifth switch SW5 turned on.

When the first signal SP transitions from the first logic level to the second logic level, the first switch SW1 and the fifth switch SW5 are turned off, the second switch SW2 and the sixth switch SW6 are turned on, and the output node NO is charged by the sum of the voltage of the error amplification signal CPIN and the battery voltage VBAT.

When the first signal SP is in the second logic level, that is, when the second signal SPB is in the first logic level, the voltage level of the error amplification signal CPIN applied to the input node NI charges the second capacitor C2 with respect to the ground voltage VGN with the third switch SW3 and the seventh switch SW7 turned on.

When the first signal SP transitions from the second logic level to the first logic level, the third switch SW3 and the seventh switch SW7 are turned off, the fourth switch SW4 and the eighth switch SW8 are turned on, and the output node NO is charged by the sum of the voltage of the error amplification signal CPIN and the battery voltage VBAT.

Figure 7:
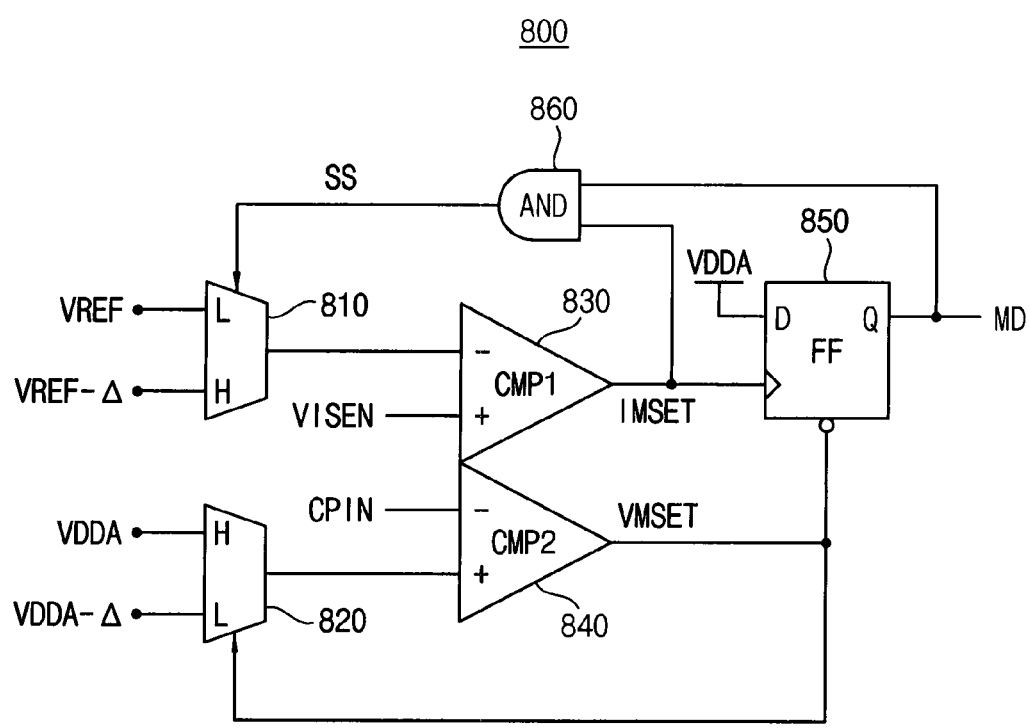
FIG. 7 is a circuit diagram illustrating an example embodiment of a mode controller included in the load switch circuit of FIG. 2.

FIG. 7 is a circuit diagram illustrating an example embodiment of a mode controller included in the load switch circuit of FIG. 2.

Referring to FIG. 7, a mode controller 800 may include a first selector 810, a second selector 820, a first comparator CMP1 830, a second comparator CMP2 840, a flip-flop 850 and a logic gate AND 860.

The first selector 810 selects and outputs one of the reference voltage VREF and a lowered reference voltage VREF-$\Delta$ lower than the reference voltage VREF in response to a selection signal SS.

The second selector 820 selects and outputs one of a power supply voltage VDDA and a lowered power supply voltage VDDA-$\Delta$ lower than the power supply voltage VDDA in response to a voltage mode setting signal VMSET.

The first comparator 830 compares an output of the first selector 810 and the current sensing signal VISEN to generate a current mode setting signal IMSET.

The second comparator 840 compares an output of the second selector 820 and the error amplification signal CPIN to generate the voltage mode setting signal VMSET.

The flip-flop 850 is reset in response to the voltage mode setting signal VMSET and is set in response to the current mode setting signal IMSET to generate the mode signal MD.

The logic gate 860 performs a logic operation on the current mode setting signal IMSET and the mode signal MD to generate the selection signal SS.

Figure 8:
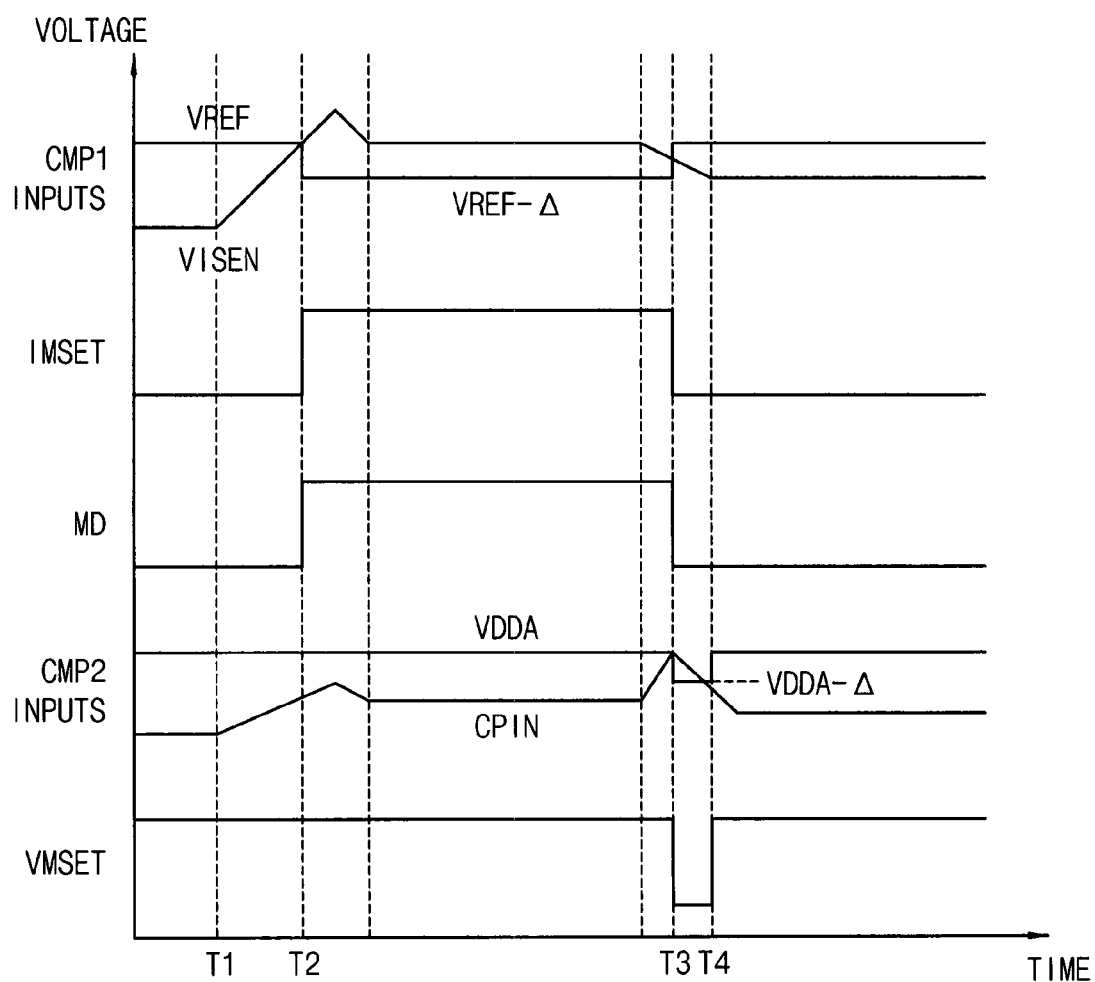
FIG. 8 is a timing diagram illustrating an operation of the mode controller of FIG. 7.

FIG. 8 is a timing diagram illustrating an operation of the mode controller of FIG. 7.

FIG. 8 illustrates the reference voltage VREF, the lowered reference voltage VREF-Δ and the current sensing signal VISEN which are input to the first comparator CMP1, the power supply voltage VDDA, the lowered power supply voltage VDDA-Δ and the error amplification signal CPIN which are input to the second comparator CMP2, the current mode setting signal IMSET, the mode signal MD and the voltage mode setting signal VMSET.

Referring to FIGS. 7 and 8, at time point T1, the charging current ICHG begins to increase and thus the voltage of the current sensing signal VISEN increases. At time point T2 when the voltage of the current sensing signal VISEN increases and exceeds the reference voltage VREF, the current mode setting signal IMSET output from the first comparator 830 transitions form the first logic level, for example, the logic low level L, to the second logic level, for example, the logic high level H.

At time point T2, the flip-flop 850 is set in response to the current mode setting signal IMSET and the mode signal MD output from the flip-flop 850 transitions from the logic low level L to the logic high level H. Accordingly, at time point T2, the selection signal SS output from the logic gate 860 transitions from the logic low level L to the logic high level H, and the negative input (−) of the first comparator 830 is changed from the reference voltage VREF to the lowered reference voltage VREF-Δ.

When the voltage of the current sensing signal VISEN is decreased lower than the reference voltage VREF, the voltage of the error amplification signal CPIN from the error amplifier 500 increases.

At time point T3 when the voltage of the error amplification signal CPIN is equal to the power supply voltage VDDA where the error amplification signal CPIN is the amplified signal of the difference between the reference voltage VREF and the selection voltage signal VSEL, the mode signal MD transitions from the logic high level H to the logic low level L. At time point T3, the flip-flop 850 is reset in response to the voltage mode setting signal VMSET and the mode signal MD transitions from the logic high level H to the logic low level L.

At time point T3, the selection signal SS transitions from the logic high level H to the logic low level L according to the transition of the mode signal MD, the first selector 810 selects the reference voltage VREF, and thus the negative input (−) of the first comparator 830 is changed from the lowered reference voltage VREF-Δ to the reference voltage VREF. In addition, at time point T3, the second selector 820 selects the lowered power supply voltage VDDA-Δ in response to the voltage mode setting signal VMSET and thus the positive input (+) of the second comparator 840 is changed from the power supply voltage VDDA to the lowered power supply voltage VDDA-Δ.

At time point T4 when the error amplification signal CPIN increases and becomes equal to the lowered power supply voltage VDDA-Δ, the voltage mode setting signal VMSET transitions from the logic low level L to the logic high level H, and thus the positive input (+) of the second comparator 840 returns to the power supply voltage VDDA from the lowered power supply voltage VDDA-Δ.

The hysteresis scheme may be applied such that one of the reference voltage VREF and the lowered reference voltage VREF is selected and one of the power supply voltage VDDA and the lowered power supply voltage VDDA-Δ is selected depending on the direction of signal transition. Through such hysteresis scheme, the frequent transitions of the mode signal MD may be prevented and the operation of the load switch circuit 1000 may be stabilized.

As such, the load switch circuit 1000 may operate in the voltage control mode to control the charging current ICHG based on the voltage sensing signal VVSEN when the mode signal MD has the first logic level (e.g., the logic low level L). In contrast, the load switch circuit 1000 may operate in the current control mode to control the charging current ICHG based on the current sensing signal VISEN when the mode signal MD has the second logic level (e.g., the logic high level H).

Figure 9:
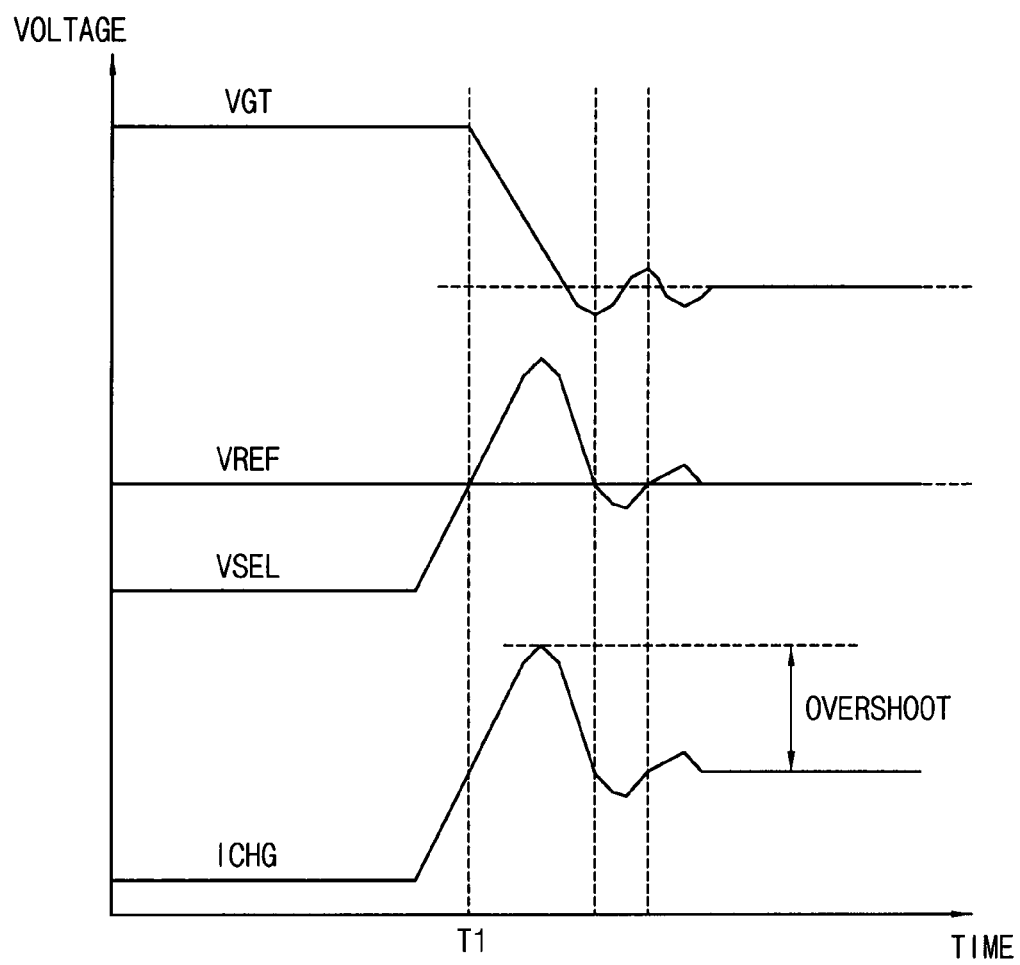
FIG. 9 is a related-art timing diagram illustrating an operation of a load switch circuit operating in a current control mode.
Figure 10:
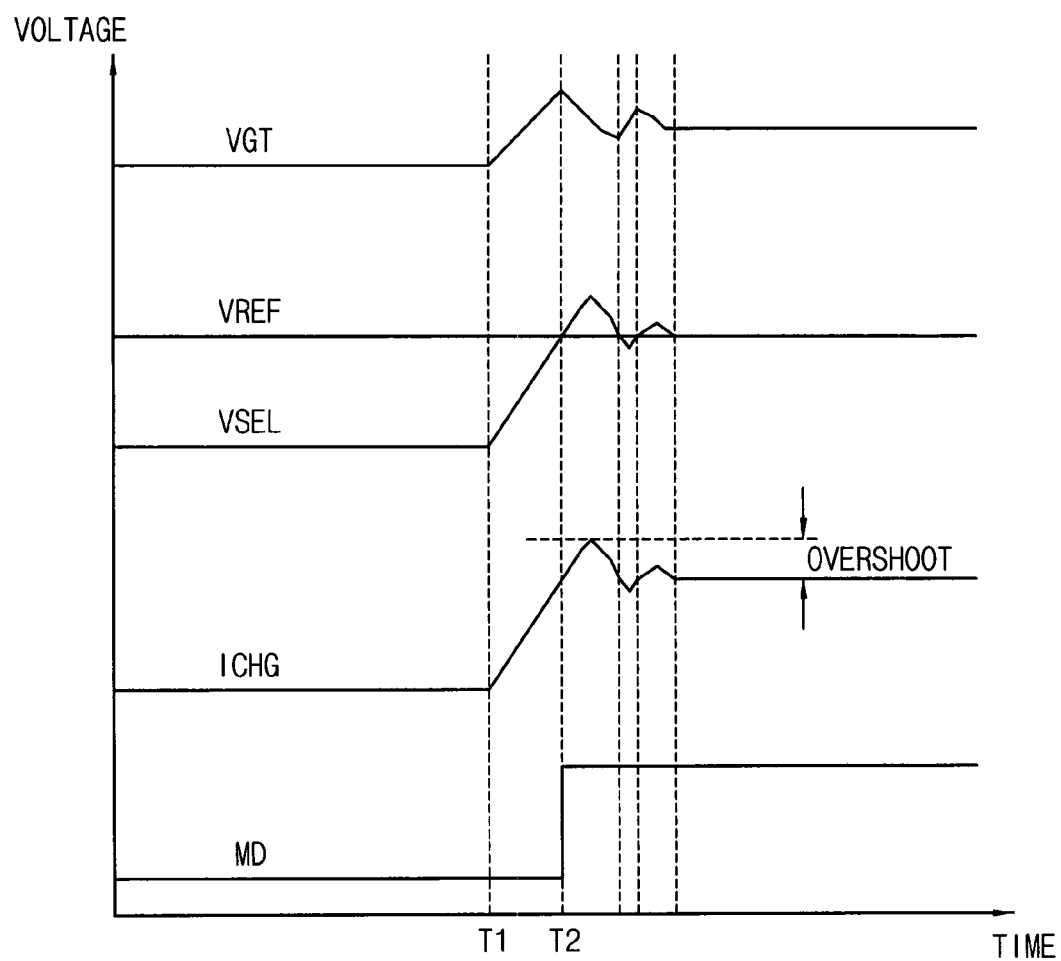
FIG. 10 is a timing diagram illustrating an operation of a load switch circuit according to example embodiments.

FIG. 9 is a related-art timing diagram illustrating an operation of a load switch circuit operating in a current control mode, and FIG. 10 is a timing diagram illustrating an operation of a load switch circuit according to example embodiments.

FIGS. 9 and 10 illustrate waveforms of the charging control signal VGT and the selection voltage signal VSEL according to change of the charging current ICHG where the charging control signal VGT corresponds to a gate voltage of the charging transistor MSW and the voltage sensing signal VVSEN is the output from the error amplifier 500.

Referring to FIG. 9, in the load switch circuit controlled by only the current control loop, the charging control signal VGT maintains the same voltage level until time point T1, when the voltage of the selection voltage signal VSEL becomes equal to the reference voltage VREF, and then begins to decrease from time point T1. The decreasing speed of the charging control signal VGT is determined according to a direct current (DC) slew of the error amplifier 500. The charging current ICHG applied to the battery until the voltage of the charging control signal VGT is decreased sufficiently may be considered as overshoot.

Referring to FIG. 10, in the load switch circuit including the current control loop and the voltage control loop according to example embodiments, the load switch circuit operates in the voltage control mode when the charging current ICHG is lowered than the limit current level. In the voltage control mode, the voltage of the selection voltage signal VSEL begins to increase at time point T1 when the charging current ICHG begins to increase.

At time point T2 when the voltage of the selection voltage signal VSEL becomes equal to the reference voltage VREF, the mode signal MD transitions and the load switch circuit is switched from the voltage control mode to the current control mode. Because the charging control signal VGT may have the sufficiently low voltage level while the charging current ICHG is low, the overshoot with respect to the change of the charging current ICHG may be limited efficiently and thus the overshoot may be reduced in comparison with that of FIG. 9.

Figure 11:
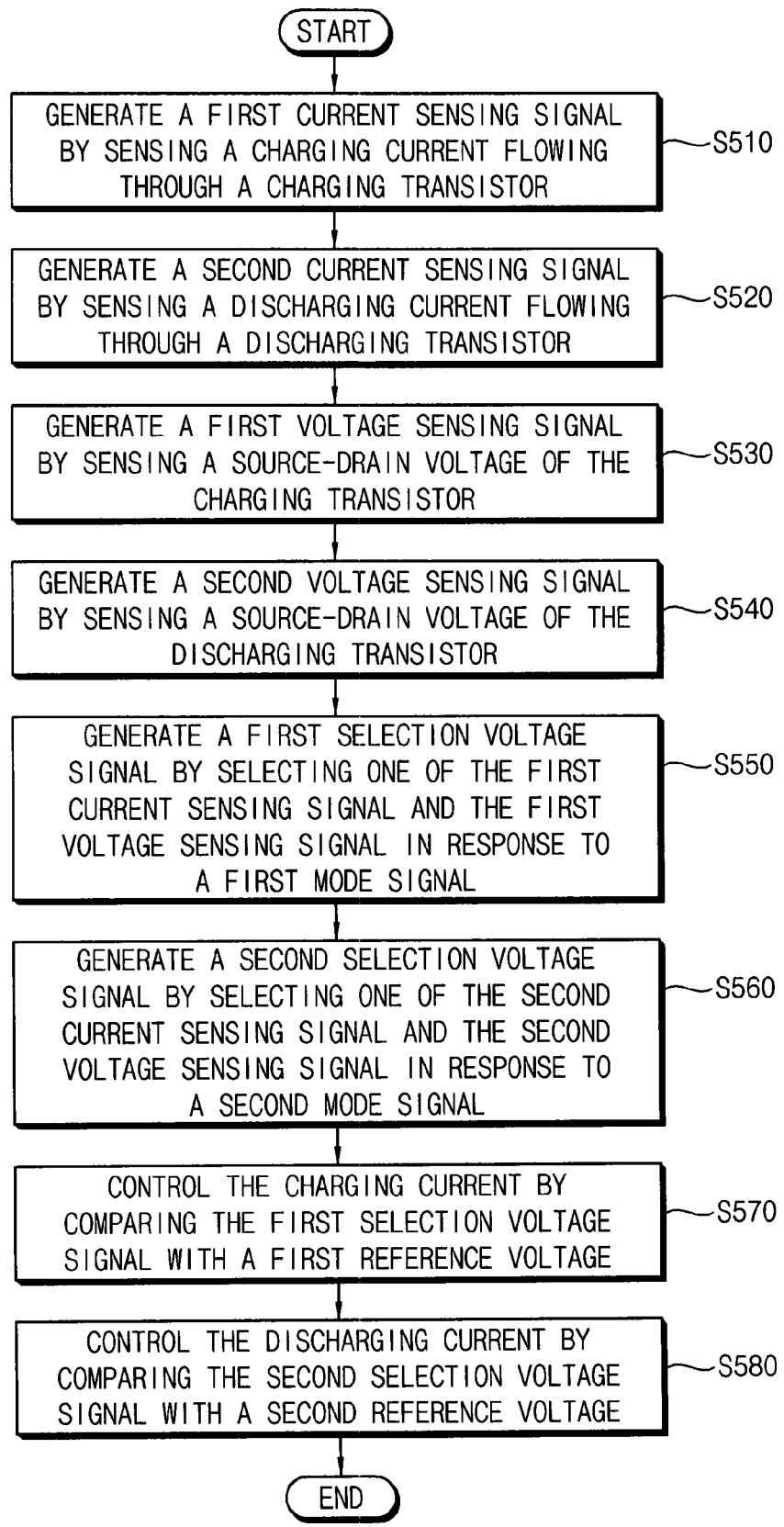
FIG. 11 is a flow chart illustrating a method of controlling battery power according to example embodiments.

FIG. 11 is a flow chart illustrating a method of controlling battery power according to example embodiments.

Referring to FIG. 11, a first current sensing signal is generated by sensing a charging current flowing through a charging transistor (S510). In addition, a second current sensing signal is generated by sensing a discharging current flowing through a discharging transistor, which is connected in series with the charging transistor (S520). The first current sensing signal may be a voltage signal having a voltage level that is varied depending on a magnitude of the charging current, and the second current sensing signal may be a voltage signal having a voltage level that is varied depending on a magnitude of the discharging current. Example embodiments of generating the first and second current sensing signals are the same or similar as described with reference to FIG. 3.

A first voltage sensing signal is generated by sensing a source-drain voltage of the charging transistor (S530). In addition, a second voltage sensing signal is generated by sensing a source-drain voltage of the discharging transistor (S540). The first voltage sensing signal may be a voltage signal having a voltage level that is varied depending on a magnitude of a source-drain voltage of the charging transistor, and the second voltage sensing signal may be a voltage signal having a voltage level that is varied depending on a magnitude of a source-drain voltage of the discharging transistor. Example embodiments of generating the first and second voltage sensing signals are the same or similar as described with reference to FIG. 4.

A first selection voltage signal is generated by selecting one of the first current sensing signal and the first voltage sensing signal in response to a first mode signal (S550). In addition, a second selection voltage signal is generated by selecting one of the second current sensing signal and the second voltage sensing signal in response to a second mode signal (S560). The first mode signal may indicate whether the charging current is lower than a first limit current level, and the second mode signal may indicate whether the discharging current is lower than a second limit current level. According to example embodiments, the first limit current level may be equal to or different from the second limit current level.

The first mode signal may have a first logic level when the charging current is lower than the first limit current level and a second logic level when the charging current is higher than the first limit current level. The second mode signal may have a first logic level when the charging current is lower than the second limit current level and a second logic level when the charging current is higher than the second limit current level. Example embodiments of generating the first and second mode signals are the same or similar as described with reference to FIGS. 7 and 8.

The charging current is controlled by comparing the first selection voltage signal with a first reference voltage (S570). In addition, the discharging current is controlled by comparing the second selection voltage signal with a second reference voltage (S580). The control of the charging current may be performed by controlling a gate voltage applied to a gate electrode of the charging transistor. The control of the discharging current may be performed by controlling a gate voltage applied to a gate electrode of the discharging transistor. Example embodiments of generating the gate voltages, that is, a charging control signal and a discharging control signal are the same or similar as described with reference to FIGS. 5 and 6.

When the charging current is lower than the first limit current level, the first voltage sensing signal may be selected as the first selection voltage signal, and when the discharging current is lower than the second limit current level, the second voltage sensing signal may be selected as the second selection voltage signal. In these cases, the charging current and discharging current may be controlled based on the first voltage sensing signal and the second voltage sensing signal, respectively, in the voltage control mode.

In contrast, when the charging current is higher than the first limit current level, the first current sensing signal may be selected as the first selection voltage signal, and when the discharging current is higher than the second limit current level, the second current sensing signal may be selected as the second selection voltage signal. In these cases, the charging current and the discharging current may be controlled based on the first current sensing signal and the second current sensing signal, respectively, in the current control mode.

As such, the method of controlling battery power using the load switch circuit according to example embodiments may reduce overshoot and/or undershoot of the charging current and/or the discharging current efficiently by performing selectively the voltage control mode or the current control mode based on the magnitude of the charging current and/or the magnitude of the discharging current.

Figure 12:
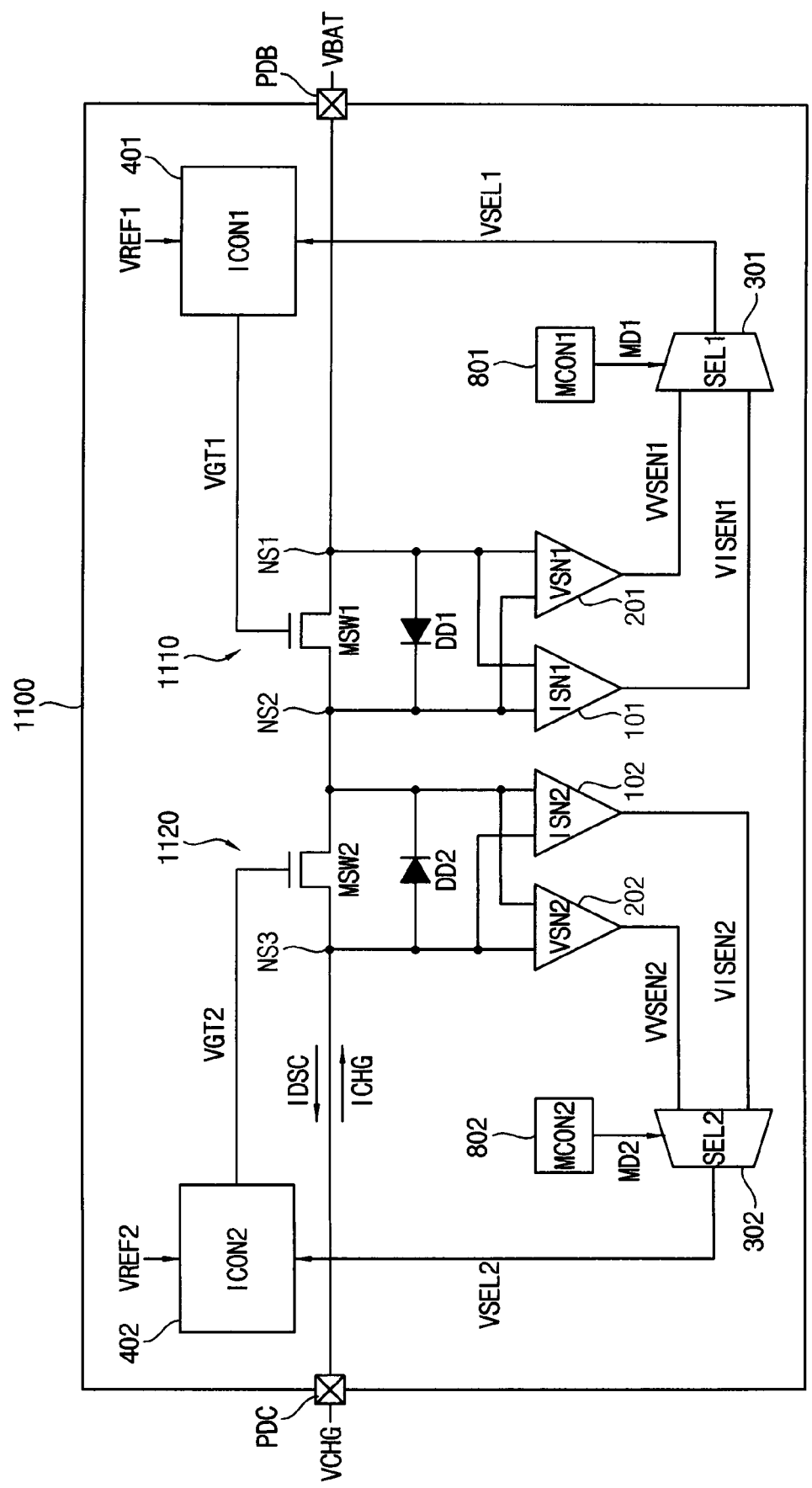
FIG. 12 is a block diagram illustrating a load switch circuit according to example embodiments.

FIG. 12 is a block diagram illustrating a load switch circuit according to example embodiments.

Referring to FIG. 12, the load switch circuit 1100 includes a charging switch circuit 1110 and a discharging switch circuit 1120.

The charging switch circuit 1110 may include a charging transistor MSW1, a first current sensor ISN1 101, a first voltage sensor VSN1 201, a first selector SEL1 301, a first current controller ICON1 401, a first mode controller MCON1 801 and a first diode DDE The discharging switch circuit 1120 may include a discharging transistor MSW2, a second current sensor ISN2 102, a second voltage sensor VSN2 202, a second selector SEL2 302, a second current controller ICON2 402, a second mode controller MCON2 802 and a second diode DD2.

The charging transistor MSW1 is connected between a first switch node NS1 to which a battery voltage VBAT is applied and a second switch node NS2 and controls a charging current ICHG in response to a charging control signal VGT1.

The discharging transistor MSW2 is connected between a third switch node NS3 to which a charging voltage VCHG is applied and the second switch node NS2 and controls a discharging current IDSC in response to a discharging control signal VGT2.

The first switch node NS1 and the second switch node NS2 correspond to a drain node and a source node of the charging transistor MSW1, and the third switch node NS3 and the second switch node NS2 correspond to a drain node and a source node of the discharging transistor MSW2.

The charging current ICHG is a current flowing through the charging transistor MSW1 from the second switch node NS2 to the first switch node NS1 when the charging voltage VCHG is higher than the battery voltage VBAT. The discharging current IDSC is a current flowing through the discharging transistor MSW2 from the second switch node NS2 to the third switch node NS3 when the charging voltage VCHG is lower than the battery voltage VBAT. In some example embodiments, the charging transistor MSW1 and the discharging transistor MSW2 may be implemented with NMOS transistors.

The first current sensor 101 is connected to the first switch node NS1 and the second switch node NS2 and senses the charging current ICHG to generate a first current sensing signal VISEN1.

The second current sensor 102 is connected to the third switch node NS3 and the second switch node NS2 and senses the discharging current IDSC to generate a second current sensing signal VISEN2.

The first voltage sensor 201 is connected to the first switch node NS1 and the second switch node NS2 and senses a source-drain voltage of the charging transistor MSW1 to generate a first voltage sensing signal VVSEN1.

The second voltage sensor 202 is connected to the third switch node NS3 and the second switch node NS2 and senses a source-drain voltage of the discharging transistor MSW2 to generate a second voltage sensing signal VVSEN2.

In some example embodiments, the load switch circuit 1100 may be implemented as one small chip that may be mounted in a mobile device. In this case, the load switch circuit 1100 may include a charging pad PDC to which the charging voltage VCHG is applied and a battery pad PDB to which the battery voltage VBAT is applied. The charging pad PDC may be connected to internal components of the mobile device such as a charging control circuit, power management integrated circuit, and so on. The battery pad PDB may be directly connected to a battery mounted in the mobile device.

The first selector 301 selects one of the first current sensing signal VISEN1 and the first voltage sensing signal VVSEN1 in response to a first mode signal MD1 to generate a first selection voltage signal VSEL1.

The second selector 302 selects one of the second current sensing signal VISEN2 and the second voltage sensing signal VVSEN2 in response to a second mode signal MD2 to generate a second selection voltage signal VSEL2.

The first current controller 401 compares the first selection voltage signal VSEL1 with a first reference voltage VREF1 to generate the charging control signal VGT1.

The second current controller 402 compares the second selection voltage signal VSEL2 with a second reference voltage VREF2 to generate the discharging control signal VGT2.

The first diode DD1 is connected between the first switch node NS1 and the second switch node NS2. The anode electrode of the first diode DD1 is connected to the first switch node NS1 and the cathode electrode of the first diode DD1 is connected to the second switch node NS2 so that the first diode DD1 may be turned on in a discharging status.

The second diode DD2 is connected between the third switch node NS3 and the second switch node NS2. The anode electrode of the second diode DD2 is connected to the third switch node NS3 and the cathode electrode of the second diode DD2 is connected to the second switch node NS2 so that the second diode DD2 may be turned on in a charging status.

When the battery connected to the battery pad PDB is charged through the load switch circuit 1100, the charging transistor MSW1 is controlled in the voltage control mode when the charging current ICHG is lower than the first limit current level and the charging transistor MSW1 limits the charging current ICHG in the current control mode when the charging current ICHG is higher than the first limit current level. During the charging status, the source-drain voltage of the discharging transistor MSW2 is always controlled by the voltage control loop. There is no information on the discharging current IDSC during the charging status, that is, the discharging current IDSC is zero. Accordingly the gate voltage of the discharging transistor MSW2 is increased by a power supply voltage with respect to the source voltage and thus the discharging transistor MSW2 is fully turned on during the charging status.

When the battery connected to the battery pad PDB is discharged through the load switch circuit 1100, the discharging transistor MSW2 is controlled in the voltage control mode when the discharging current IDSC is lower than the second limit current level and the discharging transistor MSW2 limits the discharging current IDSC in the current control mode when the discharging current IDSC is higher than the second limit current level. During the discharging status, the source-drain voltage of the charging transistor MSW1 is always controlled by the voltage control loop. There is no information on the charging current ICHG during the discharging status, that is, the charging current ICHG is zero. Accordingly the gate voltage of the charging transistor MSW1 is increased by a power supply voltage with respect to the source voltage and thus the charging transistor MSW1 is fully turned on during the discharging status.

In the voltage control mode, the first voltage sensing signal VVSEN1 or the second voltage sensing signal VVSEN2 is selected as the first selection voltage signal VSEL1 or the second selection voltage signal VSEL2 and thus the voltage control loop comprised of the voltage sensor 201 or 202, the selector 301 or 302 and the current controller 401 or 402 is enabled. In contrast, in the current control mode, the first current sensing signal VISEN1 or the second current sensing signal VISEN2 is selected as the first selection voltage signal VSEL1 or the second selection voltage signal VSEL2 and thus the current control loop comprised of the current sensor 101 or 102, the selector 301 or 302 and the current controller 401 or 402 is enabled.

As a result, the gate voltage, that is, the voltage level of the charging control signal VGT1 is determined by the voltage control loop regardless of the current direction with respect to a current lower than the first limit current level. Also the gate voltage, that is, the voltage level of the discharging control signal VGT2 is determined by the voltage control loop regardless of the current direction with respect to a current lower than the second limit current level.

If the charging current ICHG or the discharging current IDSC is increased abruptly while the charging current ICHG or the discharging current IDSC is relatively low and the voltage control loop is enabled, the load switch circuit 1100 may transition from the voltage control loop to the current control loop to rapidly limit the charging current ICHG or the discharging current IDSC. Because the load switch circuit 1100 according to example embodiments maintains the continuous loop control regardless of the magnitude of the charging current ICHG and the magnitude of the discharging current IDSC, the load switch circuit 1100 may have a rapid response speed in comparison with the conventional load switch circuit that depends on only the current loop control.

As such, the load switch circuit 1100 and the method of controlling battery power using the load switch circuit 1100 according to example embodiments may reduce overshoot and/or undershoot of the charging current ICHG and/or the discharging current IDSC efficiently by performing selectively the voltage control mode or the current control mode based on the magnitudes of the charging current ICHG and the discharging current IDSC.

Example embodiments of the charging transistor MSW1, the first current sensor 101, the first voltage sensor 201, the first selector 301, the first current controller 401 and the first mode controller 801 included in the charging switch circuit 1110 are substantially the same as described with reference to FIGS. 3 through 10.

Example embodiments of the discharging transistor MSW2, the second current sensor 102, the second voltage sensor 202, the second selector 302, the second current controller 402 and the second mode controller included in the discharging switch circuit 1120 are similar to those as described with reference to FIGS. 1 through 10. Example embodiment of the discharging switch circuit 1120 would be easily understood if, in FIGS. 1 through 10, the battery voltage VBAT is exchanged with the charging voltage VCHG, the first switch node NS1 is replaced with the third switch node NS3 and the charging current ICHG is replaced with the discharging current IDSC.

In some example embodiments, the load switch circuit according to example embodiments may not include the discharging switch circuit 1120 but include only the charging switch circuit 1110 as described with reference to FIGS. 1 through 10. In some example embodiments, the load switch circuit according to example embodiments may include both of the discharging switch circuit 1120 and the charging switch circuit 1110 as described with reference to FIGS. 10 and 11. In some example embodiments, the load switch circuit according to example embodiments may not include the charging switch circuit 1110 but include only the discharging switch circuit 1120, though not illustrated.

Figure 13:
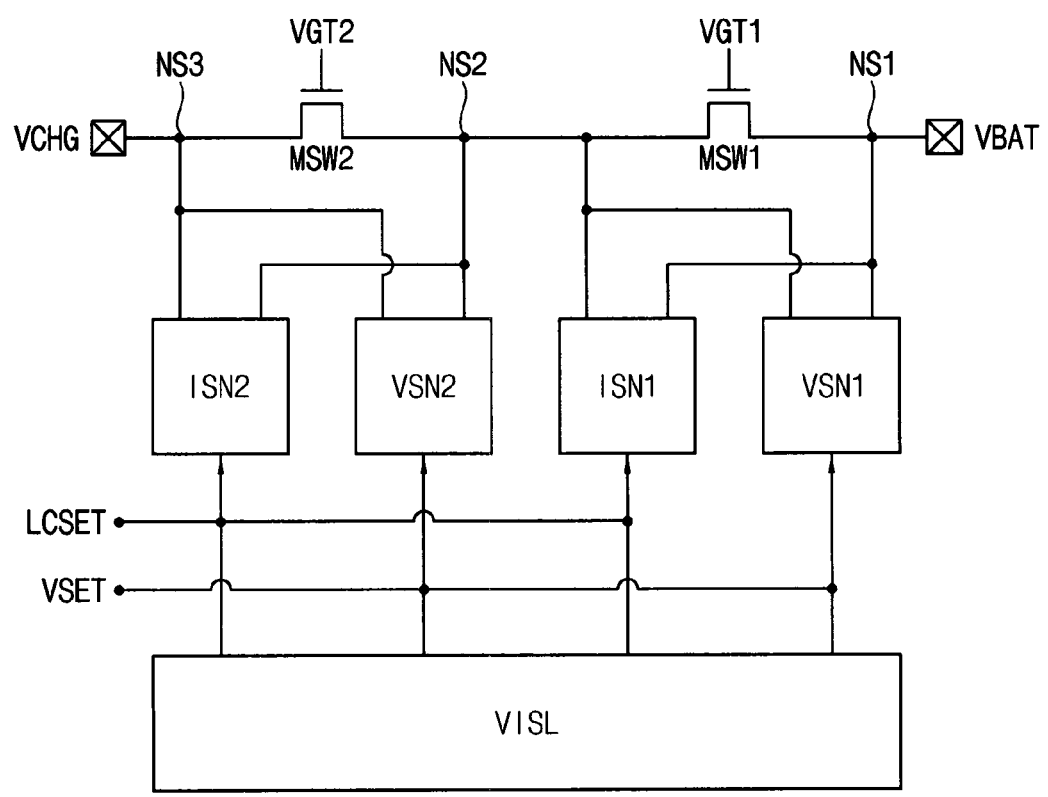
FIG. 13 is a diagram for describing charging-discharging current and control of a source-drain voltage of a charging-discharging transistor.

FIG. 13 is a diagram for describing charging-discharging current and control of a source-drain voltage of a charging-discharging transistor.

The charging transistor MSW1, the discharging transistor MSW2, the first current sensor ISN1, the second current sensor ISN2, the first voltage sensor VSN1, the second voltage sensor VSN2, the first through third switch nodes NS1~NS3, the charging voltage VCHG and the battery voltage VBAT are the same as described above, and repeated descriptions are omitted.

Referring to FIG. 13, a voltage current setting logic VISL may provide the above-described limit current setting value LCSET and the voltage setting value VSET.

As described above, the first current sensor ISN1 and the second current sensor ISN2 may include variable resistors having resistance values varying depending on the limit current setting value LCSET. In this case, the load switch circuit may control resistance values of the variable resistor to adjust the voltage levels of the first current sensing signal VISEN1 and the second current sensing signal VISEN2.

As a result, the first and second limit current levels of the charging current ICHG and the discharging current IDSC may be controlled by controlling the resistance values of the variable resistors. The limit current setting value LCSET may be a digital value of multiple bits. FIG. 13 illustrates the same limit current setting value LCSET is provided commonly to the first current sensor ISN1 and the second current sensor ISN2, but example embodiments are not limited thereto. In some example embodiments, different limit current setting values may be provided to the first current sensor ISN1 and the second current sensor ISN2, respectively.

As described above, the first voltage sensor VSN1 and the second voltage sensor VSN2 may include variable resistors having resistance values varying depending on the voltage setting value VSET. In this case, the load switch circuit may control resistance values of the variable resistor to adjust the voltage levels of the first voltage sensing signal VVSEN1 and the second voltage sensing signal VVSEN2.

As a result, the source-drain voltages of the charging transistor MSW1 and the discharging transistor MSW2 may be controlled by controlling the resistance values of the variable resistors. The voltage setting value VSET may be a digital value of multiple bits. FIG. 13 illustrates the same voltage setting value VSET is provided commonly to the first voltage sensor VSN1 and the second voltage sensor VSN2, but example embodiments are not limited thereto. In some example embodiments, different voltage setting values may be provided to the first voltage sensor VSN1 and the second voltage sensor VSN2, respectively.

The load switch circuit according to example embodiments controls the gate voltages of the charging transistor MSW1 and the discharging transistor MSW2 and thus efficiency of charging and discharging may be reduced in the low current range. However, the thermal loss may be minimized by controlling the source-drain voltages of the charging transistor MSW1 and/or the discharging transistor MSW2 in proportional to the limit current level.

For example, when the charging current ICHG is limited to 3 A (Ampere) and the source-drain voltage ΔV is set to 30 mV, the turn-on resistance of the charging transistor becomes 10 mΩ for 3 A charging. In the same conditions, when the charging current ICHG is limited to 1 A, the turn-on resistance of the charging transistor has to be 30 mΩ so as to maintain the source-drain voltage ΔV to be 30 mV.

The voltage setting value VSET may be changed to set the source-drain voltage Δ V to 10 mV so as to limit the charging current ICHG to 1 A, the turn-on resistance of the charging transistor may be 10 mΩ, and thus power consumption may be reduced in comparison with the case of 30 mΩ, turn-on resistance. As such, performance of the load switch circuit may be enhanced by controlling the limit current setting value LCSET and the voltage setting value VSET such that the limit current level of the charging current ICHG is proportional to the magnitude of the source-drain voltage of the charging transistor.

Figure 14:
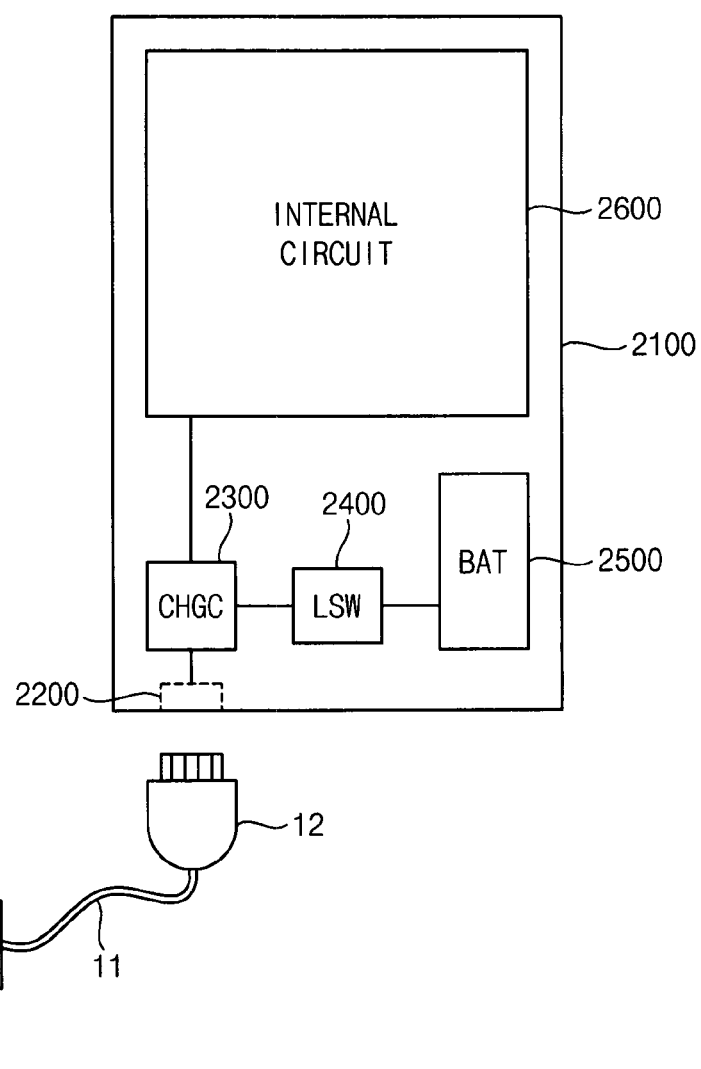
FIGS. 14 and 15 are diagrams illustrating a system including a load switch circuit according to example embodiments.
Figure 15:
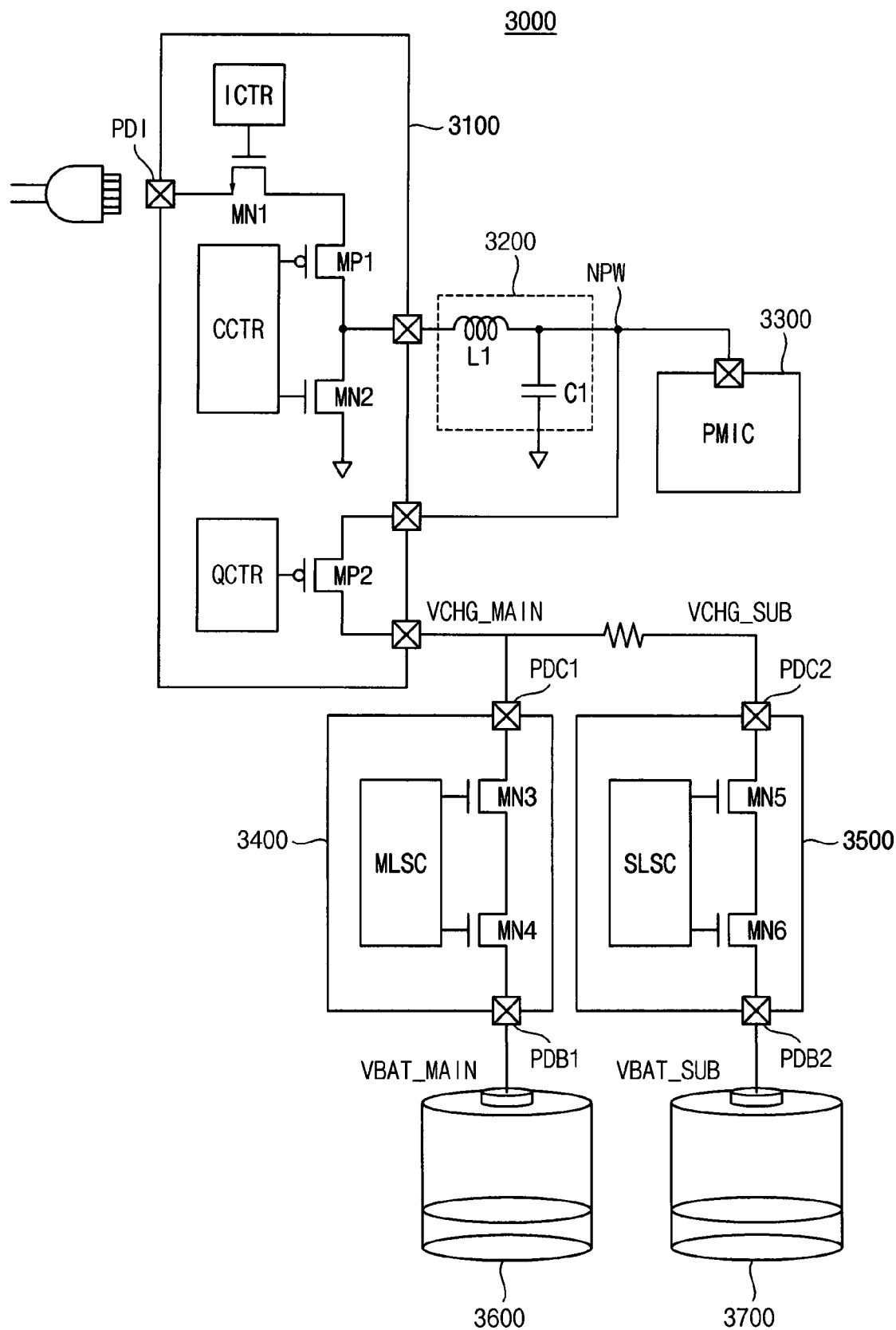

FIGS. 14 and 15 are diagrams illustrating a system including a load switch circuit according to example embodiments.

Referring to FIG. 14, a system 2000 may include a mobile device 2100 such as a smartphone and an AC-DC wall adaptor or a travel adaptor 10 to supply power to the mobile device 2100. The travel adaptor 10 may be connected to a connector 2200 of the mobile device 2100 through a cable 11 and a jack 12 to supply power to the mobile device 2100.

The mobile device 2100 may include a charging control circuit CHGC 2300, a load switch circuit LSW 2400, a battery BAT 2500 and an internal circuit 2600.

The charging control circuit 2300 may change the DC voltage from the travel adaptor 10 to provide charging power to the battery 2500 and/or operating power to the internal circuit 2600. When the travel adaptor 10 is removed, The charged power in the battery may be provided to the internal circuit 2600.

As illustrated in FIG. 14, the load switch circuit 2400 according to example embodiments may be disposed in the mobile device 2100 and directly connected to the battery 2500 mounted in the mobile device 2100.

As described above, the load switch circuit 2400 may include a charging transistor, a current sensor, a voltage sensor, a selector, a current controller and a mode controller.

The charging transistor is connected between a first switch node to which a battery voltage is applied and a second switch node to which a charging voltage is applied and controls a charging current in response to a charging control signal. The current sensor is connected to the first switch node and the second switch node and senses the charging current to generate a current sensing signal. The voltage sensor is connected to the first switch node and the second switch node and senses a source-drain voltage of the charging transistor to generate a voltage sensing signal. The selector selects one of the current sensing signal and the voltage sensing signal in response to a mode signal to generate a selection voltage signal. The current controller compares the selection voltage signal with a reference voltage to generate the charging control signal.

As such, the load switch circuit 2400 may be disposed directly in front of the battery 2500 and may reduce overshoot and/or undershoot of the charging current and/or the discharging current efficiently by performing selectively the voltage control mode or the current control mode based on the magnitude of the charging current and/or the magnitude of the discharging current.

Referring to FIG. 15, an electronic device or an electronic system 3000 may include a charging control circuit CHGC, a power management integrated circuit PMIC 3300, a main load switch circuit 3400, a sub load switch circuit 3500, a main battery 3600 and a sub battery 3700.

The charging control circuit may include a voltage converter 3100 and a low pass filter 3200. The voltage converter 3100 may include transistors MN1, MN2, MP1 and MP2 and controllers ICTR, CCTR and QCTR to control the transistors MN1, MN2, MP1 and MP2. The low pass filter 3200 may be implemented with a combination of an inductor L1 and a capacitor C1, and so on. The charging control circuit is not limited to the configuration of FIG. 15, and may be implemented variously.

The voltage converter 3100 may receive power from the travel adaptor through the input pad PDI and provide operating power through the power node NPW to the internal circuits such as the power management integrated circuit 3300. In addition, the voltage converter 3100 may provide charging power to the main battery 3600 and the sub battery 3700.

The main load switch circuit 3400 may be connected to the voltage converter 3100 through a first charging pad PDC1 to which a main charging voltage VCHG_MAIN is applied and connected to the main battery 3600 through a first battery pad PDB1 to which a main battery voltage VBAT_MAIN is applied. The sub load switch circuit 3500 may be connected to the voltage converter 3100 through a second charging pad PDC2 to which a sub charging voltage VCHG_SUB is applied and connected to the sub battery 3700 through a second battery pad PDB2 to which a sub battery voltage VBAT_SUB is applied. The main charging voltage VCHG_MAIN and the sub charging voltage VCHG_SUB may be different due to the parasitic resistance along the intermediate path.

The main load switch circuit 3400 may include a main charging transistor MN4, a main discharging transistor MN3 and a main load switch controller MLSC. The sub load switch circuit 3500 may include a sub charging transistor MN6, a sub discharging transistor MN5 and a sub load switch controller SLSC. Each of the main load switch controller MLSC and the sub load switch controller SLSC may be configured to selectively operate in the voltage control mode or current control mode based on the magnitude of the charging current and/or the discharging current as described above.

As described above, the load switch circuit, the system including the load switch circuit and the method of controlling battery power using the load switch circuit according to example embodiments may reduce overshoot and/or undershoot of the charging current and/or the discharging current efficiently by performing selectively the voltage control mode or the current control mode based on the magnitude of the charging current and/or the magnitude of the discharging current.

The present disclosure may be applied to any electronic devices and systems requiring charging and/or discharging of a battery. For example, the present disclosure may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. A load switch circuit comprising:
   a charging transistor connected between a first switch node to which a battery voltage is applied and a second switch node to which a charging voltage is applied and configured to control a charging current in response to a charging control signal;
   a current sensor connected to the first switch node and the second switch node and configured to sense the charging current to generate a current sensing signal;
   a voltage sensor connected to the first switch node and the second switch node and configured to sense a source-drain voltage of the charging transistor to generate a voltage sensing signal;
   a selector configured to select one of the current sensing signal and the voltage sensing signal in response to a mode signal to generate a selection voltage signal; and
   a current controller configured to compare the selection voltage signal with a reference voltage to generate the charging control signal.

2. The load switch circuit of claim 1, wherein the load switch circuit controls the charging current based on:
   the voltage sensing signal in a voltage control mode when the charging current is lower than a limit current level, and
   the current sensing signal in a current control mode when the charging current is higher than the limit current level.

3. The load switch circuit of claim 1, wherein the current sensor includes a first variable resistor and adjust a resistance value of the first variable resistor based on a limit current setting value to adjust a limit current level of the charging current.

4. The load switch circuit of claim 3, wherein the current sensor includes a second variable resistor and adjust a resistance value of the second variable resistor based on a voltage setting value to adjust a magnitude of the source-drain voltage of the charging transistor.

5. The load switch circuit of claim 4, wherein the load switch circuit controls the limit current setting value and the voltage setting value such that the limit current level of the charging current is proportional to the magnitude of the source-drain voltage of the charging transistor.

6. The load switch circuit of claim 1, wherein the current sensor includes:
   an N-type metal oxide semiconductor (NMOS) transistor connected between the second switch node and a first node and configured to operate in response to the charging control signal;
   a P-type metal oxide semiconductor (PMOS) transistor connected between the first node and a second node and configured to operate in response to an amplification signal;
   a resistor connected between the second node and a ground voltage; and
   a sense amplifier configured to amplify a difference between a sensing voltage at the first node and the battery voltage at the first switch node to generate the amplification signal.

7. The load switch circuit of claim 6, wherein the resistor included in the current sensor is a variable resistor and the load switch circuit controls a resistance value of the variable resistor to adjust a magnitude of the charging current.

8. The load switch circuit of claim 1, wherein the voltage sensor includes:
   a first resistor connected between the second switch node and a first node;
   a PMOS transistor connected between the first node and a second node and configured to operate in response to an amplification signal;
   a second resistor connected between the second node and a ground voltage; and
   a sense amplifier configured to amplify a difference between a sensing voltage at the first node and battery voltage at the first switch node to generate the amplification signal.

9. The load switch circuit of claim 8, wherein the second resistor included in the voltage sensor is a variable resistor and the load switch circuit controls a resistance value of the variable resistor to adjust a magnitude of the source-drain voltage.

10. The load switch circuit of claim 1, wherein the current controller includes:
    an error amplifier configured to amplify a difference between the reference voltage and the selection voltage signal to generate an error amplification signal; and
    a charge pump configured to sum the error amplification signal and the battery voltage to generate the charging control signal.

11. The load switch circuit of claim 10, wherein the charge pump includes:
    a first switch connected between an input node receiving the error amplification signal and a first node and configured to operate in response to a first signal;
    a second switch connected between the first node and an output node outputting the charging control signal and configured to operate in response to a second signal corresponding to an inverted signal of the first signal;
    a third switch connected between the input node and a second node and configured to operate in response to the second signal;
    a fourth switch connected between the second node and the output node and configured to operate in response to the first signal;
    a first capacitor connected between the first node and a third node;
    a fifth switch connected between the third node and a ground voltage and configured to operate in response to the first signal;
    a sixth switch connected between the third node and the battery voltage and configured to operate in response to the second signal;
    a second capacitor connected between the first node and a fourth node;
    a seventh switch connected between the fourth node and the ground voltage and configured to operate in response to the second signal; and
    an eighth switch connected between the fourth node and the battery voltage and configured to operate in response to the first signal.

12. The load switch circuit of claim 1, further comprising a mode controller configured to generate the mode signal indicating a voltage control mode or a current control mode based on the current sensing signal and the selection voltage signal.

13. The load switch circuit of claim 12, wherein the mode controller transitions the mode signal from:
    a first logic level to a second logic level at a time point when a voltage of the current sensing signal increases and exceeds the reference voltage, and
    the second logic level to the first logic level at a time point when a voltage of an error amplification signal is equal to a power supply voltage, the error amplification signal being an amplified signal of a difference between the reference voltage and the selection voltage signal.

14. The load switch circuit of claim 13, wherein the load switch circuit operates in:
    a voltage control mode to control the charging current based on the voltage sensing signal when the mode signal has the first logic level, and
    a current control mode to control the charging current based on the current sensing signal when the mode signal has the second logic level.

15. The load switch circuit of claim 12, wherein mode controller includes:
    a first selector configured to select and output one of the reference voltage and a lowered reference voltage lower than the reference voltage in response to a selection signal;
    a second selector configured to select and output one of a power supply voltage and a lowered power supply voltage lower than the power supply voltage in response to a voltage mode setting signal;
    a first comparator configured to compare an output of the first selector and the current sensing signal to generate a current mode setting signal;
    a second comparator configured to compare an output of the second selector and an error amplification signal to generate the voltage mode setting signal;
    a flip-flop configured to be reset in response to the voltage mode setting signal and configured to be set in response to the current mode setting signal to generate the mode signal; and a logic gate configured to perform a logic operation on the current mode setting signal and the mode signal to generate the selection signal.

16. The load switch circuit of claim 1, further comprising a diode including an anode electrode connected to the first switch node and a cathode electrode connected to the second switch node.

17. The load switch circuit of claim 1, wherein the load switch circuit is directly connected to a battery that is mounted in a mobile device.

18. A load switch circuit comprising:
a charging transistor connected between a first switch node to which a battery voltage is applied and a second switch node and configured to control a charging current in response to a charging control signal;
a discharging transistor connected between a third switch node to which a charging voltage is applied and the second switch node and configured to control a discharging current in response to a discharging control signal;
a first current sensor connected to the first switch node and the second switch node and configured to sense the charging current to generate a first current sensing signal;
a second current sensor connected to the third switch node and the second switch node and configured to sense the discharging current to generate a second current sensing signal;
a first voltage sensor connected to the first switch node and the second switch node and configured to sense a source-drain voltage of the charging transistor to generate a first voltage sensing signal;
a second voltage sensor connected to the third switch node and the second switch node and configured to sense a source-drain voltage of the discharging transistor to generate a second voltage sensing signal;
a first selector configured to select one of the first current sensing signal and the first voltage sensing signal in response to a first mode signal to generate a first selection voltage signal;
a second selector configured to select one of the second current sensing signal and the second voltage sensing signal in response to a second mode signal to generate a second selection voltage signal;
a first current controller configured to compare the first selection voltage signal with a first reference voltage to generate the charging control signal; and
a second current controller configured to compare the second selection voltage signal with a second reference voltage to generate the discharging control signal.

19. A method of controlling battery power, comprising:
generating a first current sensing signal by sensing a charging current flowing through a charging transistor;
generating a first voltage sensing signal by sensing a source-drain voltage of the charging transistor;
generating a first selection voltage signal by selecting one of the first current sensing signal and the first voltage sensing signal in response to a first mode signal; and
controlling the charging current by comparing the first selection voltage signal with a first reference voltage.

20. The method of claim 19, further comprising:
generating a second current sensing signal by sensing a discharging current flowing through a discharging transistor;
generating a second voltage sensing signal by sensing a source-drain voltage of the discharging transistor;
generating a second selection voltage signal by selecting one of the second current sensing signal and the second voltage sensing signal in response to a second mode signal; and
controlling the discharging current by comparing the second selection voltage signal with a second reference voltage.

* * * * *